United States Patent
Watchko et al.

(10) Patent No.: US 6,451,374 B1
(45) Date of Patent: Sep. 17, 2002

(54) MANUFACTURE OF LOW CLOSURE FORCE, FORM-IN-PLACE EMI SHIELDING GASKET

(75) Inventors: George R. Watchko, Stoneham, MA (US); David P. Boland, Saugus, MA (US); Rakesh N. Shah, Lowell, MA (US); Dean R. Gagne, Derry, NH (US); Todd E. Sousa, Brush Prairie, WA (US)

(73) Assignee: Parker-Hannifin Corporation, Cleveland, OH (US)

(*) Notice: Subject to any disclaimer, the term of this patent is extended or adjusted under 35 U.S.C. 154(b) by 0 days.

(21) Appl. No.: 09/703,240

(22) Filed: Oct. 31, 2000

Related U.S. Application Data

(60) Provisional application No. 60/183,395, filed on Feb. 18, 2000.

(51) Int. Cl.⁷ ................................................. B05D 5/12
(52) U.S. Cl. ........................ 427/58; 427/77; 427/284; 427/287
(58) Field of Search ..................... 427/58, 77, 284, 427/286, 287

(56) References Cited

U.S. PATENT DOCUMENTS

| | | | |
|---|---|---|---|
| 4,181,313 A | | 1/1980 | Hillier et al. |
| 4,419,168 A | | 12/1983 | Paul |
| 4,643,864 A | * | 2/1987 | Martini |
| 4,857,668 A | | 8/1989 | Buonanno |
| 4,952,448 A | | 8/1990 | Bullock et al. |
| 5,028,739 A | | 7/1991 | Keyser et al. |
| 5,105,056 A | | 4/1992 | Hoge, Jr. et al. |
| 5,142,101 A | | 8/1992 | Matsuzaki et al. |
| 5,202,536 A | | 4/1993 | Buonanno |
| 5,641,438 A | * | 6/1997 | Bunyan et al. |
| 5,731,541 A | | 3/1998 | Bernd et al. |
| 5,882,729 A | | 3/1999 | Kahl et al. |
| 5,910,524 A | | 6/1999 | Kalinoski |
| 6,121,545 A | * | 9/2000 | Peng et al. |

FOREIGN PATENT DOCUMENTS

| | | |
|---|---|---|
| EP | 0 643 551 A1 | 3/1995 |
| EP | 0 643 552 A1 | 3/1995 |
| JP | 5-7177 | 1/1993 |

OTHER PUBLICATIONS

International Application No. WO95/07603 published under the Patent Cooperation Treaty Mar. 1995.
International Application No. WO96/22672 published under the Patent Cooperation Treaty Jul. 1996.
International Application No. WO98/54942 published under the Patent Cooperation Treaty Dec. 1998.
Chomerics Parker Hannifin Corporation "EMI Shielding and Grounding Spacer Gaskets" dated 1996.
Copy of International Search Report in corresponding PCT Application No. PCT/US00/29438.

* cited by examiner

*Primary Examiner*—Fred J. Parker
(74) *Attorney, Agent, or Firm*—John A. Molnar, Jr.

(57) ABSTRACT

A method of forming a low closure force gasket having alternating high and low contact points. The gasket is formed-in-place (FIP) on a surface of a substrate as a bead of a curable elastomeric composition which is issued under an applied pressure from the orifice of a nozzle. The is nozzle is movable relative to the surface of the substrate along at least a first axis disposed generally parallel to the substrate surface, and, optionally, along a second axis disposed generally perpendicular to the substrate surface. The nozzle is moved at a predetermined speed along the first axis, and, optionally, along the second axis to apply the bead along a given path on the substrate. One or more of the applied pressure, the speed of movement of the nozzle along the first axis of step, and the movement of the nozzle along the second axis are controlled to apply the bead in a periodic series of alternating high and low intervals relative to the substrate surface. The elastomeric composition then is cured under substantially atmospheric pressure to form the gasket on the substrate surface, with the high intervals of the bead defining the high contact points of the gasket, and with the low intervals of the bead defining the low contact portions of the gasket.

12 Claims, 2 Drawing Sheets

MANUFACTURE OF LOW CLOSURE FORCE, FORM-IN-PLACE EMI SHIELDING GASKET

CROSS-REFERENCE TO RELATED CASES

The present application claims priority to U.S. Provisional Application Serial No. 60/183,395; filed Feb. 18, 2000.

BACKGROUND OF THE INVENTION

The present invention relates broadly to form-in-place (FIP) electromagnetic interference (EMI) shielding gaskets or seals which are formed and cured in place under atmospheric pressure on the surface of a substrate, and particularly to a FIP method of making a low closure force FIP gasket which is particularly adapted for use within small electronics enclosures such as cellular phone handsets and other handheld electronic devices.

The operation of electronic devices such as televisions, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is inserted between the source and the other devices, and typically is configured as an electrically conductive and grounded housing which encloses the device. As the circuitry of the device generally must remain accessible for servicing or the like, most housings are provided with openable or removable accesses such as doors, hatches, panels, or covers. Between even the flattest of these accesses and its corresponding mating or faying surface, however, there may be present gaps which reduce the efficiency of the shielding by presenting openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna. In this regard, bulk or surface currents induced within the housing develop voltage gradients across any interface gaps in the shielding, which gaps thereby function as antennas which radiate EMI noise. In general, the amplitude of the noise is proportional to the gap length, with the width of the gap having less appreciable effect.

For filling gaps within mating surfaces of housings and other EMI shielding structures, gaskets and other seals have been proposed both for maintaining electrical continuity across the structure, and for excluding from the interior of the device such contaminates as moisture and dust. Such seals are bonded or mechanically attached to, or press-fit into, one of the mating surfaces, and function to close any interface gaps to establish a continuous conductive path thereacross by conforming under an applied pressure to irregularities between the surfaces. Accordingly, seals intended for EMI shielding applications are specified to be of a construction which not only provides electrical surface conductivity even while under compression, but which also has a resiliency allowing the seals to conform to the size of the gap. The seals additionally must be wear resistant, economical to manufacture, and capability of withstanding repeated compression and relaxation cycles. For further information on specifications for EMI shielding gaskets, reference may be had to Severinsen, J., "Gaskets That Block EMI," Machine Design, Vol. 47, No. 19, pp. 74–77 (Aug. 7, 1975).

EMI shielding gaskets typically are constructed as a resilient core element having gap-filling capabilities which is either filled, sheathed, or coated with an electrically conductive element. The resilient core element, which may be foamed or unfoamed, solid or tubular, typically is formed of an elastomeric thermoplastic material such as polyethylene, polypropylene, polyvinyl chloride, or a polypropylene-EPDM blend, or a thermoplastic or thermosetting rubber such as a butadiene, styrene-butadiene, nitrile, chlorosulfonate, neoprene, urethane, or silicone rubber.

Conductive materials for the filler, sheathing, or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Alternatively, other conductive particles and fibers such as carbon, graphite, or a conductive polymer material may be substituted.

Conventional manufacturing processes for EMI shielding gaskets include extrusion, molding, or die-cutting, with molding or die-cutting heretofore being preferred for particularly small or complex shielding configurations. In this regard, die-cutting involves the forming of the gasket from a cured sheet of an electrically-conductive elastomer which is cut or stamped using a die or the like into the desired configuration. Molding, in turn, involves the compression or injection molding of an uncured or thermoplastic elastomer into the desired configuration.

More recently, a form-in-place (FIP) process has been proposed for the manufacture of EMI shielding gaskets. As is described in commonly-assigned, co-pending application U.S. Ser. No. 08/967,986, filed Nov. 12, 1997; U.S. Pat. Nos. 5,910,524 and 5,641,438; European Patent Applications EP 643,551 and 643,552; and PCT Applications WO/9622672 and WO/9507603; and in U.S. Pat. Nos. 5,882,729 and 5,731,541; and Japanese Patent Publication (Kokai) No. 7177/1993, such process involves the application of a bead of a viscous, curable, electrically-conductive composition which is dispensed in a fluent state from a nozzle directly onto to a surface of a substrate such as a housing or other enclosure. The composition, typically a silver-filled or otherwise electrically-conductive silicone elastomer, then is cured-in-place via the application of heat or with atmospheric moisture or ultraviolet (UV) radiation to form an electrically-conductive, elastomeric EMI shielding gasket in situ on the substrate surface. By forming and curing the gasket in place directly on the substrate surface, the need for separate forming and installation steps is obviated. Moreover, the gasket may be adhered directly to the surface of the substrate to further obviate the need for a separate adhesive component or other means of attachment of the gasket to the substrate. In contrast to more conventional die cutting or molding processes, the flashless FIP process reduces waste generation, and additionally is less labor intensive in that the need for hand assembly of complex gasket shapes or the mounting of the gasket into place is obviated. The process, which is marketed commercially under the name CHO-FORM® by the Chomerics Division of Parker-Hannifin Corp., Woburn, Mass., further is amenable to an automated or roboticly-controlled operation, and may be employed to fabricate complex gasket geometries under atmospheric pressure and without the use of a mold.

As the above-described FIP process continues to garner commercial acceptance, it will be appreciated that further improvements in this process and in materials therefor would be well-received by the electronics industry. In this regard, certain applications specify a low impedance, low profile gasket which is deflectable under relatively low closure force loads, e.g., about 0.4–10 Newton per centimeter of gasket length. Generally, a minimum deflection, typically of about 10%, is specified to ensure that the gasket sufficiently conforms to the mating housing or board surfaces to develop an electrically conductive pathway therebetween. It has been observed that for certain applications, however, that the closure or other deflection force required to effect the specified minimum deflection of the FIP gasket profiles heretofore known in the art may be higher than can be accommodated by the particular housing or board assembly design. Thus, it will be appreciated that further improvements in the manufacture of FIP gaskets profiles would be well-received by the electronics industry. As the sizes of handheld electronic devices such as cellular phone handsets has continued to shrink, especially desired therefore would be a low closure force FIP gasket profile which is especially adapted for use in the smaller electronics enclosures which are rapidly becoming the industry standard.

Broad Statement of the Invention

The present invention is directed to the FIP manufacture of a low closure force EMI shielding spacer gasket profile especially adapted for use in smaller electronic enclosure packages. In having a periodic "interrupted" pattern of alternating local maxima and minima bead heights, the gasket profile of the present invention is seen to exhibit lower closure force requirements than the FIP gasket profiles heretofore known in the art. That is, for a specified joint configuration, the spacer gasket profile of the present invention exhibits a greater deflection under a given compressive load than conventional profiles.

Conventionally, and as is described further in commonly-assigned, co-pending application U.S. Ser. No. 09/042,135, filed Mar. 13, 1998, in the Technical Publication, "EMI Shielding and Grounding Spacer Gasket," Parker Chomerics Division, Woburn, Mass. (1996), and in PCT application 98/54942, the "interrupted" EMI shielding gaskets of the type herein involved are formed principally by molding. The present invention, however, provides for the manufacture of these gaskets as a series of FIP beads which are dispensed as a fluent composition from a nozzle directly onto to a surface of a substrate such as a housing or other enclosure, and then cured in situ under atmospheric pressure on the surface of a substrate. The composition may be provided as a filled silicone elastomer which is curable in place, such as via the application of heat or with atmospheric moisture or ultraviolet (UV) radiation, to form an electrically-conductive, elastomeric EMI shielding gasket in situ on the substrate surface. Advantageously, by forming and curing the gasket in place directly on the substrate surface, the need for separate forming and installation steps is obviated. Moreover, the gasket may be adhered directly to the surface of the substrate to further obviate the need for a separate adhesive component or other means of attachment of the gasket to the substrate.

The present invention, therefore, comprehends the formation of a low closure force gasket having alternating high and low contact points. The gasket is formed-in-place (FIP) on a surface of a substrate as a bead of a curable elastomeric composition which is issued under an applied pressure from the orifice of a nozzle. The is nozzle is movable relative to the surface of the substrate along at least a first axis disposed generally parallel to the substrate surface, and, optionally, along a second axis disposed generally perpendicular to the substrate surface. The nozzle is moved at a predetermined speed along the first axis, and, optionally, along the second axis to apply the bead along a given path on the substrate. One or more of the applied pressure, the speed of movement of the nozzle along the first axis of step, and the movement of the nozzle along the second axis are controlled to apply the bead in a periodic series of alternating high and low intervals relative to the substrate surface. The elastomeric composition then is cured under substantially atmospheric pressure to form the gasket on the substrate surface, with the high intervals of the bead defining the high contact points of the gasket, and with the low intervals of the bead defining the low contact portions of the gasket.

In one disclosed embodiment the movement of the nozzle along the second axis is controlled by reciprocating the nozzle intermediate an upper and a lower position relative to the substrate surface. Such movement defines with the movement of the nozzle along the first axis a generally sinusoidal motion of the nozzle within a plane disposed transverse to the substrate surface. Through such motion, the bead may be applied to the substrate surface as having a generally continuous wavefrom profile of alternating peaks and troughs, with the peaks defining the high intervals of the bead and the troughs defining the low intervals of the bead.

In another disclosed embodiment, the speed of movement of the nozzle along the first axis is controlled by defining a series of spaced-apart points along the path. As the nozzle approaches each of these points, the speed of the nozzle is decreased and, thereafter, accelerated as the nozzle travels intermediate each of the points.

In another disclosed embodiment, the applied pressure is periodically increased and decreased as the nozzle is moved along the first axis.

In yet another disclosed embodiment, the applied pressure and the speed of movement of the nozzle along the first axis both are controlled by defining a series of spaced-apart points along the path. The movement of the nozzle along the first axis is stopped at each of these points for a predetermined dwell period with pressure being applied to issue the bead from the nozzle. Thereupon, the nozzle is moved intermediate each of the points with the application of the pressure being discontinued to stop the bead from issuing from the nozzle. Through such control, the bead may be applied to the substrate surface in a pattern of discrete dots which define the high intervals of the bead. The dots are separated by spaces which define the low intervals of the bead.

Advantages of the present invention include the manufacture of a gasket profile for low closure force applications such as may be found in small, handheld electronic devices. Additional advantages include a method of manufacture by which such gasket profile may be formed-in-placed via the application of a bead of a viscous, curable, electrically-conductive composition which is dispensed in a fluent state from a nozzle directly onto to a surface of a substrate such as a housing or other enclosure. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

DETAILED DESCRIPTION OF THE INVENTION

Figure 1:
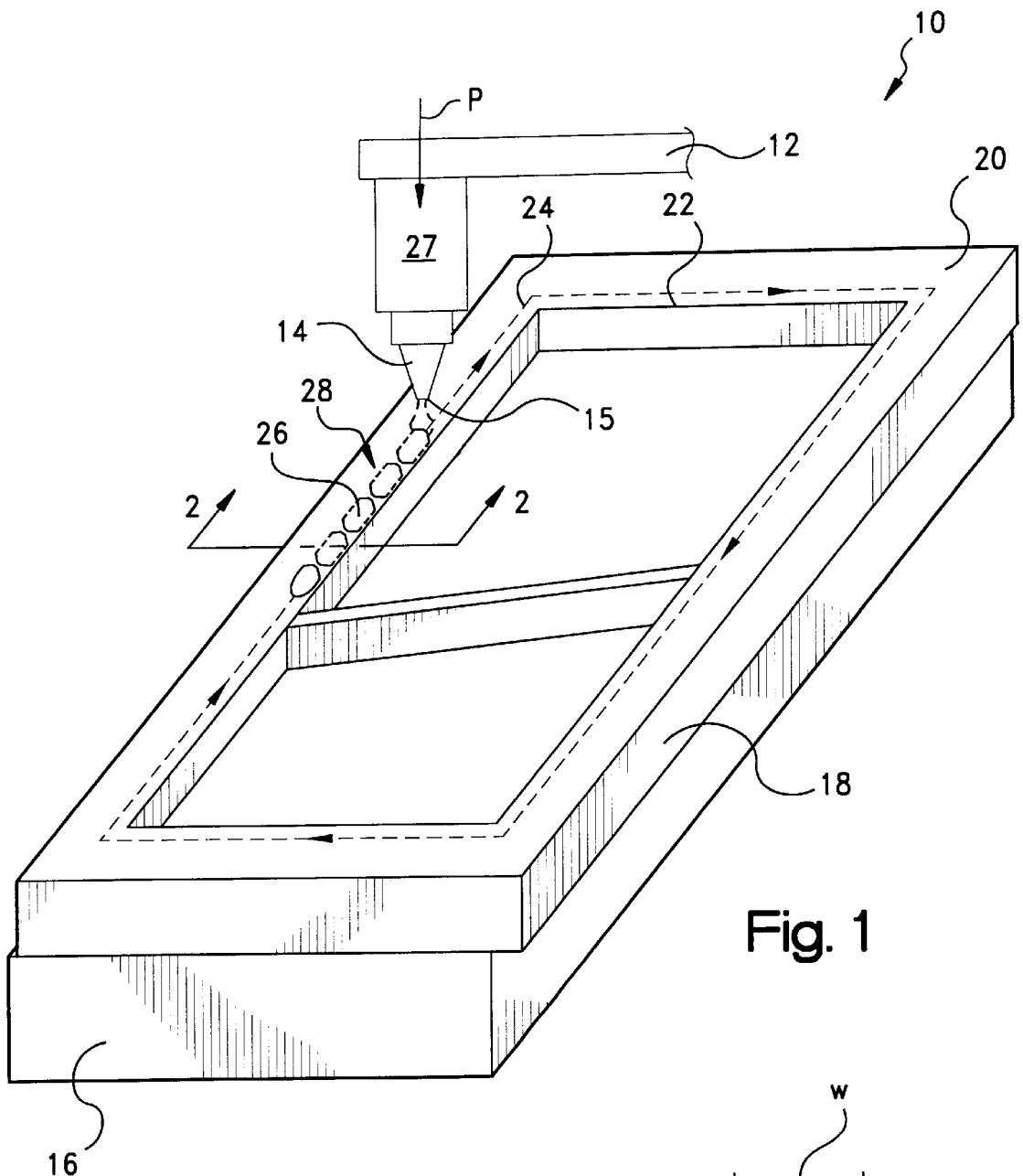
FIG. 1 is a perspective, somewhat schematic view of a representative system for the application of the interrupted gasket of the present invention.

Certain terminology may be employed in the description to follow for convenience rather than for any limiting purpose. For example, the terms "forward," "rearward," "right," "left," "upper," and "lower" designate directions in the drawings to which reference is made, with the terms "inward," "inner," or "inboard" and "outward," "outer," or "outboard" referring, respectively, to directions toward and away from the center of the referenced element, and the terms "radial" and "axial" referring, respectively, to directions perpendicular and parallel to the central longitudinal axis of the referenced element. Terminology of similar import other than the words specifically mentioned above likewise is to be considered as being used for purposes of convenience rather than in any limiting sense.

For the purposes of the discourse to follow, the precepts of the invention herein involved are described in connection with the application of an elastomeric, electrically-conductive, form-in-place (FIP) electromagnetic interference (EMI) shielding gasket onto an enclosure or spacer frame of an electronic device. It will be appreciated, however, that aspects of the present invention may find utility in other EMI shielding applications, or, in a non-electrically-conductive or a thermally-conductive embodiment, for environmental sealing or heat transfer applications. Use within those such other applications therefore should be considered to be expressly within the scope of the present invention.

In accordance then with an aspect of the present invention, a fluent polymeric, curable reaction system is provided as having components which form an electrically-conductive, elastomeric material when admixed and, in a thermal-addition curable embodiment, heated to a predefined cure temperature. Such system is especially adapted for use as a form-in-place EMI gasket material in being dispensable as a generally non-slumping or form stable bead of a fluent, viscous admixture which is issued from a nozzle or other orifice onto the surface of a substrate such as the housing of an electronic device. Upon being heated to a predefined temperature or, alternatively, reaction with atmospheric moisture or exposure to ultraviolet (UV) radiation, the material may be cured in situ to form a resilient gasket profile which adheres to the substrate surface. The gasket so formed is capable of filling gaps between mating surfaces of housings and other EMI shielding structures for the environmental sealing thereof, while concomitantly providing for electrical continuity between those surfaces.

In a thermal addition curable embodiment, the reaction system of the present invention is formulated as a fluent admixture of: (a) a polymeric binder component, i.e., resin, having first functional groups; (b) a cross-linking component having second functional groups reactive with the first functional groups of the binder component; (c) a catalyst component effective to catalyze the reaction of the first and second functional groups; and (d) an electrically-conductive filler. The reaction system is especially adapted for use in a form-in-place process wherein a fluent bead of the admixed components of the system is applied to the surface of a substrate, such as a housing or other enclosure for electronic components, and then is cured by heating in situ on that surface to form an electrically-conductive, corrosion-resistant, elastomeric EMI shielding gasket. In accordance with the precepts of the present invention, the filler is blended or otherwise incorporated into the reaction system as a particulate medium.

By "fluent," it is meant that the admixed composition exhibits representative fluid flow characteristics allowing it to be extruded under pressure through a dispensing nozzle, needle, or other orifice at a given flow velocity. For example, flow rates through a 0.5 to 2 mm orifice of between about 0.025–2.75 g/min at from about 275–400 kPa typically are observed. The uncured composition, moreover, is provided to be sufficiently viscous, e.g., 1,000–10,000 poise at 25° C., such that it may be dispensed on a substrate as a generally continuous, form-stable bead and thereafter cured directly thereon under atmospheric pressure without the use of a mold. By "form-stable," it is meant that the uncured bead of the composition which is applied to the substrate exhibits less than about 25% slump, sag, or running prior to the curing thereof to form an elastomeric gasket material.

The binder component and cross-linking component may be provided as forming a cured elastomeric material via a thermal addition polymerization, i.e., a vulcanization or cross-linking mechanism, when admixed. By "cured" it is meant that the binder of the composition is polymerized, cross-linked, further cross-linked or polymerized, vulcanized, cooled, hardened, or otherwise chemically or physically changed from a liquid or other fluent form into a solid elastomeric or polymeric phase. Thermal addition cure systems, which may be foamed or unfoamed, of the general type herein involved are well-known and characterized by a curing mechanism involving the direct cross-linking reaction of functional group species on adjacent molecules which also may be oligomers or polymers. The cross-linking reaction is thermally accelerated and has a cure profile which may include a predefined cure or critical temperature for a given heating time.

The curing reaction may occur between the same molecules or functional groups, and alternatively may be moisture or UV-catalyzed at ambient temperature. In a thermal-cure, silicone-based embodiment, the system incorporates an elastomeric, silicone-based binder component having a first functional species, such as vinyl groups, and a silicone-based cross-linking agent having a second functional species, such as hydride groups, different from the first functional species but which are reactive therewith. That is, the first and second species exhibit reactive affinity above a certain activation energy level such that a thermally-induced cross-linking reaction is effected at temperatures at or above a particular cure temperature resulting in the curing of the reaction system to form a form-stable elastomeric material. As used herein, the term "elastomeric" is ascribed its conventional meaning of exhibiting rubber-like properties of compliancy, resiliency, low compression set, flexibility, and an ability to recover after deformation, i.e., stress relaxation. As with silicone elastomers in general, the preferred silicone material exhibits properties such as thermal and oxidation resistance over a wide temperature range, and well as resistance to many chemicals and to weather effects, which makes it especially suited for use as an EMI shielding gasket. In addition to improved corrosion resistance, the material further exhibits excellent electrical properties including resistance to corona breakdown over a wide range of temperatures and humidity.

Together, the binder and cross-linking component, each of which may have a respective weight average molecular weight of between about 70,000–90,000, may be classified as a silicone-based, thermal-addition curable or cross-linking elastomeric composition. A particularly preferred combination includes a linear vinyl-terminated siloxane polymer, such as vinyl-terminated polydimethyl siloxane, as the binder component, and at least a stoichiometric, molar amount of a hydride-terminated siloxane, siloxane polymer, or siloxane copolymer, as the cross-linking agent. In a preferred embodiment of the invention, the binder and cross-linking agent components are admixed in a one-part system. Alternatively, the binder component may be included in a first part of a two-part system, with the cross-linking agent component being included in a second part formulated to be mixed in equal volumetric proportion with the first component part. In either system, one or both parts additionally may include a carrier, such as a silicone or silicone-compatible fluid, a diluent such as toluene, alcohol, or other organic solvent, or additional binder component including the first functional group species. Silicone-based compositions of particularly preferred variety are marketed commercially by Dow Corning Corp., Midland, Mich., by General Electric Co., Silicone Products Div., Pittsfield, Mass., and particularly by Shin-Etsu Corp., Torrance, Calif., under the designations 1820 and 1830.

An inhibitor such as 2-methyl, 3-butyn 20', polyvinylmethyl siloxane, or octamethyltrisiloxane optionally may be included in the single part or in the second part of the two-part formulation for inhibiting the reaction at room temperature between the first and second functional group species and thereby increasing the pot-life or open-time of the mixture. At elevated curing temperatures of from about 85–150° C., however, the inhibitor is volatilized to thereby allow the cross-linking reaction between the first and second functional groups to proceed to cure. A metallic catalyst, such as an organometallic platinum catalyst, likewise may be included the single part or in the first part of the two-part formulation to catalyze the thermal addition cross-linking reaction between the first and second functional groups. Generally, from about 5–10 ppm of such catalyst, based on the total weight of the functional siloxane components, is included with the first component.

Other polymeric materials suitable for use as the binder component include natural rubbers such as Hevea and thermoplastic, i.e., melt-processible, or thermosetting, i.e., vulcanizable, synthetic rubbers such as fluoropolymer, chlorosulfonate, polybutadiene, butyl, neoprene, nitrile, polyisoprene, buna-N, copolymer rubbers such as ethylene-propylene (EPR), ethylene-propylene-diene monomer (EPDM), nitrile-butadiene (NBR) and styrene-butadiene (SBR), or blends such as ethylene or propylene-EPDM, EPR, or NBR. The term "synthetic rubbers" also should be understood to encompass materials which alternatively may be classified broadly as thermoplastic or thermosetting elastomers such as polyurethanes, silicones, fluorosilicones, styrene-isoprene-styrene (SIS), and styrene-butadiene-styrene (SBS), as well as other polymers which exhibit rubber-like properties such as plasticized nylons, polyesters, ethylene vinyl acetates, and polyvinyl chlorides.

In an electrically-conductive embodiment, the silicone-based or other elastomeric binder component is rendered electrically conductive via its loading with an electrically-conductive filler. Suitable electrically-conductive fillers include nickel and nickel-plated substrates such as graphite, noble metal-based fillers, and particularly silver-based fillers such as: pure silver; silver-plated noble metals such as silver-plated gold; silver-plated non-noble metals such as silver-plated copper, nickel, aluminum, and tin; and silver-plated glass, ceramics, plastics, and mica; and mixtures thereof. The shape of the filler is not considered critical to the present invention, and may include any shape that is conventionally involved in the manufacture or formulation of conductive materials of the type herein involved including solid spheres, hollow microspheres, flakes, platelets, fibers, rods, or irregularly-shaped particles. Similarly, the particle size of the filler is not considered critical, but generally will be in the range of from about 0.250–250 $\mu$m, with a range of from about 0.250–75 $\mu$m being preferred.

The filler is loaded in the composition in a proportion sufficient to provide the level of electrical conductivity and EMI shielding effectiveness in the cured gasket which is desired for the intended application. For most applications, a strip volume resistivity of between about 1–50 m$\Omega$-cm, with an attendant an EMI shielding effectiveness of at least 10 dB, and preferably at least 20 dB, and most preferably at least 80 dB or higher, over a frequency range of from about 10 MHz to 12 GHz, is considered acceptable. Such conductivity and shielding effectiveness translates to a filler proportion which generally is between about 10–80% by volume, based on the total volume of the reaction system, and preferably is between about 20–70% by volume. As is known, however, the ultimate shielding effectiveness of the cured gasket will vary based on the amount of electrically-conductive material in the filler and the imposed load or deflection, typically between about 10–50%, of the gasket.

As aforementioned, a solvent or other diluent may be employed during the compounding of the formulation to lower the viscosity of the material for improved mixing and delivery. Other conventional theological agents and additives, such as pigments, microwave-attenuating or thermally-conductive fillers, lubricants, wetting agents, stabilizers, antioxidants, coloring or opacifying agents, fire retardants, chain extending oils, tackifiers, blowing agents, foaming or anti-foaming agents, and the like, optionally may be incorporated into the formulation depending upon the requirements of the particular application envisioned.

Formulated as described, the admixed thermal addition reaction system of the present invention is essentially thermosetting following a prescribed cure schedule. Such a cure schedule involves the exposure of the composition to a cure temperature of between about 85–150° C., for a period of between about 30–60 minutes, or otherwise until a full cure is effected. For example, within the preferred temperature range and heating or cure times, compression sets at 50% deflection of about 30–50% may be achieved. Of course, the total thermal energy transferred is a function of both the cure temperature and the heating time, with cure time and temperature being inversely proportional. That is, the cure is thermally accelerated such that lower cure temperatures require longer heating times, with higher cure temperatures requiring shorter heating times. However, it will be understood that if a moisture, i.e., RTV, or UV-curable silicone binder system is substituted for the thermal addition system of the illustrated embodiment, then the heating step may be eliminated or replaced with the exposure of the material to UV radiation or ambient humidity.

The cured gasket material of the invention has been observed to exhibit primerless adhesion to a variety of substrates, including aluminum, magnesium, nickel, copper, and plastics. An initial adhesion is shown immediately after cure, which adhesion improves after aging 3–7 days at room temperature. Although not generally required, a surface primer such as a functionalized silane, a silicate ester, a silicone-based adhesive, a cyanurate, or the like, also may be used to further improve the adhesion of the gasket to the substrate. Failure modes with either primed or unprimed substrates typically are observed to be cohesive rather than adhesive.

Further as to the properties of the cured gasket material of the present invention, the gasket typically should exhibit a Shore A hardness (ASTM D2240) of less than about 90, and preferably between about 5 and 40. A closure force of less than about 12 $lb_f$/in at 50% compression and less than about 4 $lb_f$/in at 25% compression is considered preferred for most applications to allow for the deflection sufficient to provide intimate contact and electrical continuity between faying surfaces. These and other physical properties, including compression set, will vary, of course, with the filler loading, and also may be tailored for any particular application with the addition of up to about 10% of a reinforcement or other inert or reactive component. Preferred reinforcements include fumed silica and glass, with other optional additives including conventional pigments, microwave-attenuating or thermally-conductive fillers, lubricants, stabilizers, antioxidants, coloring agents, fire retardants, chain extending oils, tackifiers, blowing or foaming agents, and the like.

For commercial applications, the constituents of the reaction system may be compounded in a roll mill or other mixer. After compounding, the pre-mixed one or more component parts may be loaded into individual tubes or containers and stored for later reactive processing using a hand-held caulking gun, which may be of a cartridge-fed, static-mixer variety, or, alternatively, using automated injection equipment such as a robotic applicator having two or more degrees of freedom or an x-y table with a stationary dispensing head. For two or more part systems, the respective component parts may be admixed immediately prior to application, and then delivered as a bead of a reactive mixture to a surface of a housing or other enclosure or substrate. The mixture then is cured in situ on the substrate surface under substantially atmospheric pressure. To reduce the cycle time, the curing may be effected at an elevated temperature to accelerate the vulcanization reaction. The components alternatively may be pre-mixed and frozen for storage.

Referring now to the figures, wherein corresponding reference characters are used to designate corresponding elements throughout the several views with equivalent elements being referenced with prime designations, a representative commercial dispensing system is shown generally at 10 as including a roboticly-controlled dispense gantry, 12, having a nozzle, 14, with an orifice, 15, of a select diameter. Dispense gantry 12 is provided to be in fluid communication with a material supply system (not shown), which may include one or more proportional, pneumatically-controlled cylinders for delivering an apportioned amount of each of the one, two, or multi- part system components through an in-line static or dynamic mixer or the like. Thereafter, the admixed components may be passed to another proportioning, pneumatic cylinder for controlled delivery to gantry 12.

Gantry 12 is operated for movement in one or more axes relative to an associated table, 16. Table 16, which may be stationary or also movable in one or more axes relative to gantry 12, supports a workpiece or substrate, 18, thereon which, as is shown, may be a housing or other enclosure for an electronic device. Housing 18 has an upper surface, 20, with a periphery, 22, along which gantry 12 and/or table 16 is moved in a predetermined path, 24. As one or both of the gantry 12 or table 16 is translated relative to the other, an uncured, viscoelastic bead, referenced for illustrative purposes in phantom at 26, of the admixed material, designated at 27 as contained within gantry 12, is issued under an applied pressure, "P," from nozzle 14 of gantry 12 generally along path 24.

Figure 2:
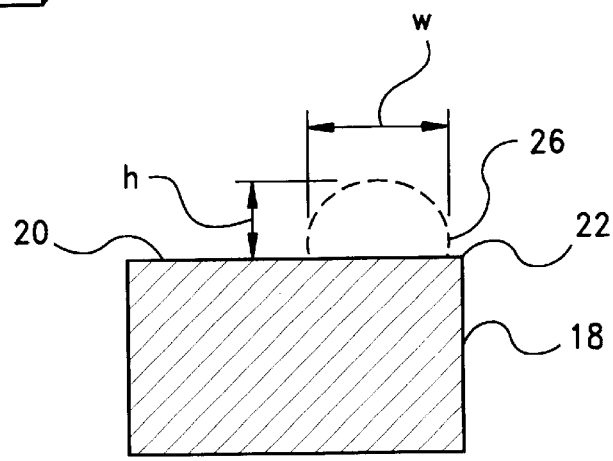
FIG. 2 is a cross-sectional view taken through line 2—2 of FIG. 1.

As may be seen with additional reference to FIG. 2, bead 26, which is non-slumping and otherwise form-stable, may be applied, as is shown, directly to the surface 20 of housing 18 or, alternatively, into a groove or channel (not shown) thereof. For typical applications such as cellular telephone housings, base stations, and the like, bead 26 will be of widthwise dimension, "w," of from about 0.2–10 mm, with an aspect ratio of width w to height, "h," of from about 0.25:1 to 3:1 or higher.

Following the completion of the bead application, housing 18 may be heated batchwise or in a conveyor oven according to a predefined cure schedule to effect the in situ curing of bead 26 into an electrically-conductive, elastomeric EMI shielding gasket, 28, which is integrally adhered to surface 20 of housing 18. Dispensing systems of the type herein involved are further described in commonly-assigned, co-pending application U.S. Ser. No. 08/967,986, filed Nov. 12, 1997; U.S. Pat. Nos. 5,910,524 and 5,641,438; European Patent Applications EP 643,551 and 643,552; and PCT Applications WO/9622672 and WO/9507603.

Figure 3:
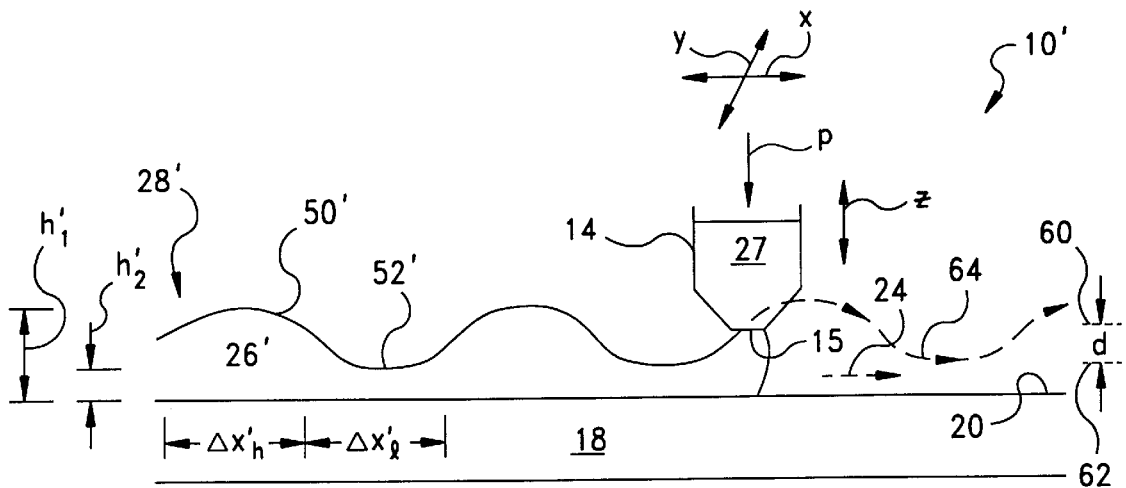
FIG. 3 is a side view of the system of FIG. 1 illustrating a representative method of control thereof for the application of the interrupted gasket of the present invention.

Turning next to FIG. 3, a representative manual or programmable method in accordance with the present invention of controlling system 10 to form a low closure force variant of FIP gasket 28 is schematically diagrammed at 10'. As may be seen, FIP gasket 28 of FIG. 1 reappears at 28' as being formed as having alternating high contact points, one of which is referenced at 50', and low contact points, one of which is referenced at 52', relative to the surface 20 of housing 18.

In accordance with method of diagram 10', nozzle 14 is provided to be movable relative to surface 20 to define path 24 along at least a first horizontal axis, "x," which is disposed in a plane which is parallel to surface 20. As is shown, nozzle 14 also may be movable in such plane along a second horizontal axis, "y," which is orthogonal to the x-axis. Optionally, nozzle 14 also may be movable in a plane perpendicular to surface 20 along a transverse or vertical axis, "z."

With a generally constant pressure P being applied to the composition 27 to issue bead 26' from the office 15 of nozzle 14, nozzle 14 is moved with gantry 12 (FIG. 1) at a predetermined speed along the x-axis and, optionally, along the y-axis, to track path 24. Concomitantly with the movement along the x and y-axes, the movement of nozzle 14 is controlled in the z-axis. Specifically, nozzle 14 is reciprocated within the plane of the z-axis intermediate an upper position, referenced at 60, relative to surface 20, and a lower position, referenced at 62, to define with the movement of nozzle 14 along the x-axis a generally sinusoidal motion, referenced at 64, within the plane of the z-axis disposed transverse to housing surface 20. Such movement of nozzle 14 along the z-axis defines a given displacement, "d." Typically, the distance of the first and second positions 60 and 62 to the housing surface 20 will range between 0.01–0.2 inch (0.25–5 mm), with the distance of the lower position 62 generally being between about 10–50% of that of the upper position 60. As a result of the described controlled movement of nozzle 14, bead 26' is applied to surface 20 in a periodic series of alternating high intervals, one of which is referenced at $\Delta x_h'$, and low intervals, one of which is referenced at $\Delta x_l'$.

In the embodiment 10' diagrammed in FIG. 3, the high and low intervals of bead 26' are formed as shown in a generally continuous waveform profile of alternating peaks, which define the high intervals $\Delta x_h'$ of the bead, and troughs, which define the low intervals $\Delta x_l'$ of the bead. The absolute height or amplitude of the high contact points 50', which define a first height, designated at "$h_1'$" of gasket 28 relative to the housing surface 20, and of the low contact points gasket 52', which define a second height designated at "$h_2'$" of gasket 28, defined by the peaks and troughs generally will depend upon the bead width w (FIG. 2), and on such variables as the applied pressure P, the relative speed of movement of nozzle 14 along the x, y, and z-axes, the nozzle displacement d, and the viscosity or other material properties of composition 27. Typically, the first and second heights $h_1'$ and $h_2'$ will range between 0.01–0.09 inch (0.25–2.3 mm), with the height of the second height $h_2'$ being less than about 10–50% that of the first height $h_1'$.

As to the longitudinal or axial spacings of the intervals $\Delta x_h'$ and $\Delta x_l'$ along path 24, which spacings may be regular or irregular, it is known that so long as a minimum electrical continuity, typically about 0.1 Ω or less, is maintained along the gasket seam, shielding effectiveness will be maintained if the spacing between the gaps in the gasket is less than about 25%, and preferably less than about 20%, of the wavelength of the radiation being shielded. Thus, gasket 26' of the present invention contemplates an interval $\Delta x_l'$ which is less than about 25% of the wavelength of a given frequency selected from the range of between about 10 MHz and about 10 GHz.

When formed as illustrated in FIG. 3, the cured gasket 28' generally will be observed to exhibit a deflection force at about 10–50% compression which is up to about 50% less than a conventional "non-interrupted" gasket of comparable dimensions. Advantageously, the use of gasket 28' therefore affords designers the option of specifying enclosures having thinner wall thicknesses and fewer screws or other securing elements, with an attendant reduction in weight, size, and cost. Moreover, as the force required to deflect the gasket to the degree necessary to ensure sufficient interfacial electrical contact for proper EMI shielding performance is reduced, greater reliability may be achieved with a corresponding reduction in any tendency of the deflecting member of the enclosure to bow as the gasket is compressed.

Figure 4:
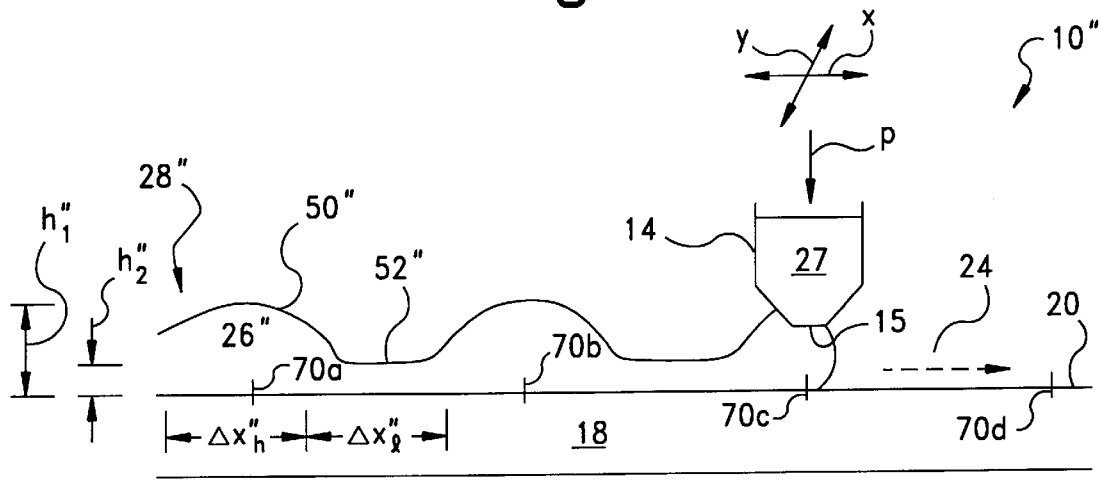
FIG. 4 is a side view of the system of FIG. 1 illustrating an alternate method of control thereof for the application of the interrupted gasket of the present invention.

Referring now to FIG. 4, an alternate control method of forming a low closure force FIP gasket variant which may be employed alone or in combination with the control method 10' of FIG. 3 is schematically diagrammed at 10". As before, FIP gasket 28 of FIG. 1 reappears at 28" as again being formed as having alternating high contact points 50", and low contact points 52" relative to the housing surface 20.

In accordance with method of diagram 10", nozzle 14 again is provided to be movable relative to surface 20 at least along the x-axis to define path 24. With a generally constant pressure P being applied to the composition 27 to issue bead 26" from the nozzle orifice 15, nozzle 14 is moved with gantry 12 (FIG. 1) at a predetermined speed along the x-axis and, optionally, along the y-axis, to track path 24. However, at the approach of each of a series of spaced-apart points, 70a–d, defined along the x and/or y-axis, the speed of nozzle 14 along that axis is decelerated in the interval $\Delta x_h"$ and, thereafter, is accelerated in the interval $\Delta x_l"$. The movement of the nozzle along the x and/or y axis further may be stopped at each of the points 70 for a predetermined time or dwell period $\Delta t$. Such control again develops localized high, 50", and low, 52", contact points of height, respectively, $h_1"$ and $h_2"$, in the intervals $\Delta x_h"$ and $\Delta x_l"$. A similar effect alternatively may be achieved with a generally constant nozzle speed along the x and/or y axis, or in combination with a varied speed, by increasing the applied pressure P to correspondingly increase the throughput of material 27 in the intervals $\Delta x_h"$, and by decreasing the applied pressure P in the intervals $\Delta x_l"$ to correspondingly decrease the throughput of material 27.

Figure 5:
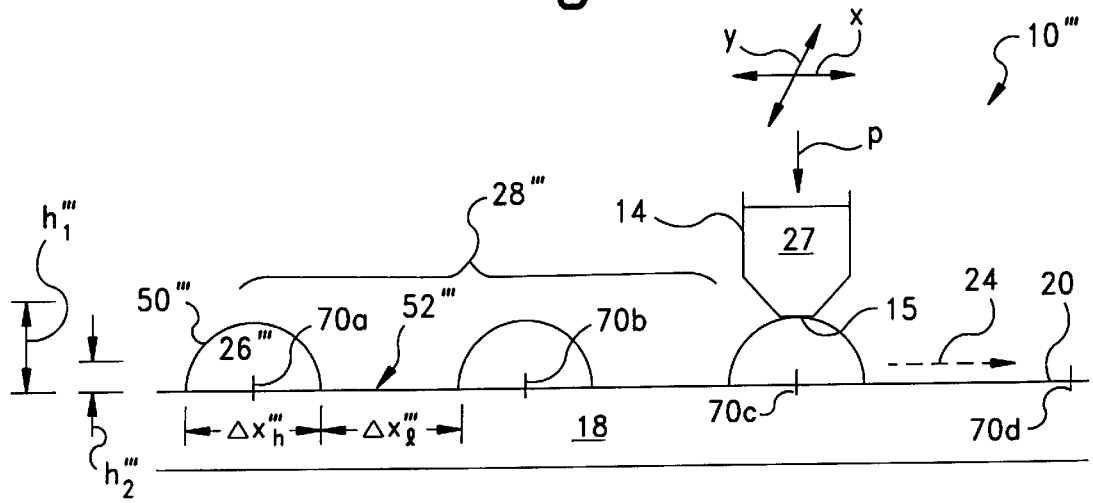
FIG. 5 is a side view of the system of FIG. 1 illustrating another alternate method of control thereof for the application of the interrupted gasket of the present invention; and The drawings will be described further in connection with the following Detailed Description of the Invention.

Looking lastly to FIG. 5, another alternate control method of forming a low closure force FIP gasket variant which may be employed alone or in combination with the control methods 10' and 10" of FIGS. 3 and 4 is schematically diagrammed at 10'". As before, FIP gasket 28 of FIG. 1 reappears at 28'" as again being formed as having alternating high and low contact points 50'" and 52'" relative to the housing surface 20, with the low contact points 52'" now being defined as a material-free space between the high contact points 50'".

In accordance with method of diagram 10'", nozzle 14 once again is provided to be movable relative to surface 20 at least along the x-axis to define path 24. With points 70 again being defined along the x and/or y-axis, the pressure P is applied to composition 27 at the approach of each of the points 70 to issue bead 26'" from the nozzle orifice 15 in the intervals $\Delta x_l'"$. Thereafter, the pressure P is discontinued to stop the issuance of bead 26'" in the intervals $\Delta x_l'"$. Such control once again develops localized high, 50'", and low, 52'", contact points of height, respectively, $h_1'"$ and $h_2'"$, in the intervals $\Delta x_h'$ and $\Delta x_l'$, with the height $h_2'"$ being zero in the material-free spaces between the high contact points 50'". The movement of the nozzle along the x and/or y axis further may be decelerated or stopped at each of the points 70 for a predetermined time or dwell period $\Delta t$, with pressure P being applied only during the dwell and terminated thereafter as the nozzle is translated between one point 70 and the next adjacent point in the progression.

In the embodiment 10'" diagrammed schematically in FIG. 5, the gasket 26'" so formed is characterized as being applied in a series of discrete domains or "pulses" of material in the intervals $\Delta x_h'"$. Depending upon the control of the nozzle speed which is exercised, the domains may be generally spherically-shaped as is shown in FIG. 5 for the case wherein the nozzle is dwelled at each of the points 70. Alternatively, the domains may be elliptically-shaped or otherwise elongated in the case where movement of the nozzle along the x or y-axes is maintained during the application of the pressure P.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. A method of forming in place a low closure force gasket having alternating high and low contact points on a surface of a substrate, said method comprising the steps of:

(a) providing a nozzle having an orifice, said nozzle being movable relative to the surface of the substrate along at least a first axis disposed generally parallel to the substrate surface to define a path, and, optionally, along a second axis disposed generally perpendicular to the substrate surface;

(b) issuing a bead of a curable elastomeric composition under an applied pressure from the orifice of said nozzle;

(c) moving said nozzle at a predetermined speed along said first axis, and, optionally, along said second axis to apply said bead of said composition to the substrate surface;

(d) controlling one or more of the pressure of step (b), the speed of movement of said nozzle along said first axis of step (c), and the movement of said nozzle along said second axis of step (c) to apply said bead in step (c) in a periodic series of alternating high and low intervals relative to the substrate surface; and (e) curing said elastomeric composition under substantially atmospheric pressure to form said gasket on the substrate surface, said high intervals of said bead defining said high contact points of said gasket and said low intervals of said bead defining said low contact portions of said gasket.

2. The method of claim 1 wherein:

the movement of said nozzle along said second axis of step (c) is controlled in step (d) by reciprocating said nozzle intermediate an upper and a lower position relative to the substrate surface to define with the movement of said nozzle along said first axis a generally sinusoidal motion of said nozzle within a plane disposed transverse to the substrate surface; and said bead is applied in step (c) as having a generally continuous waveform profile of alternating peaks and troughs, said peaks defining said high intervals of said bead and said troughs defining said low intervals of said bead.

3. The method of claim 1 wherein the speed of movement of said nozzle along said first axis of step (c) is controlled in step (d) by defining a series of spaced-apart points along said path, decelerating the speed of movement of said nozzle at the approach of each of said points, and accelerating the speed of said nozzle intermediate each of said points.

4. The method of claim 3 wherein the movement of said nozzle along said first axis of step (c) is stopped at each of said points for a predetermined dwell period.

5. The method of claim 1 wherein the pressure of step (b) is controlled in step (d) by periodically increasing and decreasing the applied pressure.

6. The method of claim 1 wherein:

the pressure of step (b) is controlled in step (d) by defining a series of spaced-apart points along said path, applying said pressure to issue said bead from said nozzle at the approach of each of said points, and discontinuing said pressure intermediate each of said points to stop said bead from issuing from said nozzle; and said bead is applied in step (c) in a series of discrete domains defining said high intervals of said bead, said domains being separated by spaces defining said low intervals of said bead.

7. The method of claim 6 wherein the speed of movement of said nozzle along said first axis of step (c) is controlled in step (d) by stopping the movement of said nozzle along said first axis at each of said points for a predetermined dwell period.

8. The method of claim 1 wherein said composition of step (b) comprises a polymeric binder component, and an electrically-conductive filler component.

9. The method of claim 8 wherein said high contact points of said gasket formed in step (e) are separated by said low contact points by a distance which is less than about 25% of the wavelength of a given frequency selected from the range of between about 10 MHz and about 10 GHz.

10. The method of claim 9 wherein said gasket formed in step (e) exhibits an EMI shielding effectiveness of at least about 80 dB substantially over a frequency range of between about 10 MHz and about 10 GHz.

11. The method of claim 8 wherein composition has a strip volume resistivity of between about 1–50 mΩ-cm.

12. The method of claim 1 wherein said high contact points of said gasket formed in step (e) define a first height of said gasket relative to the substrate surface, and wherein said low contact points define a second height of said gasket relative to the substrate surface which is less than about 50% of said first height.

* * * * *